(12) United States Patent
Liao et al.

(10) Patent No.: US 10,482,153 B2
(45) Date of Patent: Nov. 19, 2019

(54) ANALYZING METHOD AND ANALYZING SYSTEM FOR MANUFACTURING DATA

(71) Applicant: UNITED MICROELECTRONICS CORP., Hsinchu (TW)

(72) Inventors: Da-Ching Liao, Taichung (TW); Li-Chin Wang, Tainan (TW); Ya-Ching Cheng, Hsinchu (TW); Chien-Hung Chen, Hsinchu County (TW); Chun-Liang Hou, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 27 days.

(21) Appl. No.: 15/905,263

(22) Filed: Feb. 26, 2018

(65) Prior Publication Data

US 2019/0266214 A1    Aug. 29, 2019

(51) Int. Cl.
  *G06F 7/06* (2006.01)
  *G06F 17/50* (2006.01)
  *G06F 17/15* (2006.01)

(52) U.S. Cl.
  CPC ............ *G06F 17/15* (2013.01); *G06F 7/06* (2013.01); *G06F 17/50* (2013.01)

(58) Field of Classification Search
  CPC ................................. G06F 17/15; G06F 7/06
  See application file for complete search history.

(56) References Cited

U.S. PATENT DOCUMENTS

| | | | |
|---|---|---|---|
| 5,727,128 A | 3/1998 | Morrison | |
| 6,246,972 B1 | 6/2001 | Klimasauskas | |
| 8,751,273 B2 | 10/2014 | Pinto et al. | |
| 2010/0293673 A1* | 11/2010 | Bull | C12Q 1/6895 800/301 |
| 2018/0060469 A1* | 3/2018 | Morgan | G06F 17/5009 |

* cited by examiner

*Primary Examiner* — Chuong D Ngo
(74) *Attorney, Agent, or Firm* — WPAT, PC

(57) ABSTRACT

An analyzing method and an analyzing system for manufacturing data are provided. The analyzing method includes the following steps. A plurality of models each of which has a correlation value representing a relationship between at least one of a plurality of factors and a target parameter are provided. The models are screened according to the correlation values. A rank information and a frequency information of the factors are listed up according to the models. The factors are screened according to the rank information and the frequency information. The models are ranked and at least one of the models is selected.

18 Claims, 6 Drawing Sheets

ANALYZING METHOD AND ANALYZING SYSTEM FOR MANUFACTURING DATA

TECHNICAL FIELD

The disclosure relates in general to an analyzing method and an analyzing system, and more particularly to an analyzing method and an analyzing system for manufacturing data.

BACKGROUND

In a manufacturing process, manufacturing data is quite a lot and is difficult to be analyzed. For improving the manufacturing process, a big data technology, such as model diagnosis, may be used to analyze the manufacturing data. For example, in the semiconductor process, the root cause of yield loss may be more than one and needed to be picked out adequate and statistical meaning models to find out key factors.

However, the number of the models is too huge, so it is needed to invent a useful method and system to screen and reserve top few key models, such that the key models and the key factors thereof can be efficiently found.

SUMMARY

The disclosure is directed to an analyzing method and an analyzing system for manufacturing data. For analyzing the huge manufacturing data, the top few key models are screened and reserved, and the key factors are screened layer by layer. As such, the key models and the key factors thereof can be efficiently found.

According to one embodiment, an analyzing method for manufacturing data is provided. The analyzing method includes the following steps. A plurality of models each of which has a correlation value representing a relationship between at least one of a plurality of factors and a target parameter are provided. The models are screened according to the correlation values. A rank information and a frequency information of the factors are listed up according to the models. The factors are screened according to the rank information and the frequency information. The models are ranked and at least one of the models is selected.

According to another embodiment, an analyzing system for manufacturing data is provided. The analyzing system includes a model generating unit, a model screening unit, a factor information listing unit, a factor screening unit and a reporting unit. The model generating unit is for providing a plurality of models each of which has a correlation value representing a relationship between at least one of a plurality of factors and a target parameter. The model screening unit is for screening the models according to the correlation values. The factor information listing unit is for listing up a rank information and a frequency information of the factors according to the models. The factor screening unit is for screening the factors according to the rank information and the frequency information. The reporting unit is for ranking the models.

Figure 1:
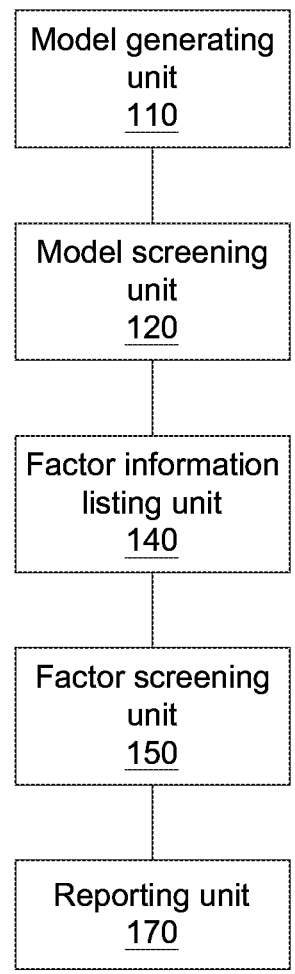
FIG. 1 shows an analyzing system for manufacturing data according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows an analyzing system 100 for manufacturing data according to one embodiment. The analyzing system 100 includes a model generating unit 110, a model screening unit 120, a factor information listing unit 140, a factor screening unit 150 and a reporting unit 170. The model generating unit 110 is used for generating a plurality of models MD. The model screening unit 120 is used for screening the models MD. The factor information listing unit 140 is used for listing up some information of a plurality of factors FT according to the models MD. The factor screening unit 150 is used for screening the factors FT. The reporting unit 170 is used for ranking the models MD for selecting the key models and the key factors thereof. The model generating unit 110, the model screening unit 120, the factor information listing unit 140, the factor screening unit 150 and the reporting unit 170 may be a chip, a circuit, a circuit board or a non-statuary computer readable medium.

The analyzing system 100 can efficiently search key factors FT from all models MD by screening and reserving top few key models MD and screening out key factors FT layer by layer.

Figure 2:
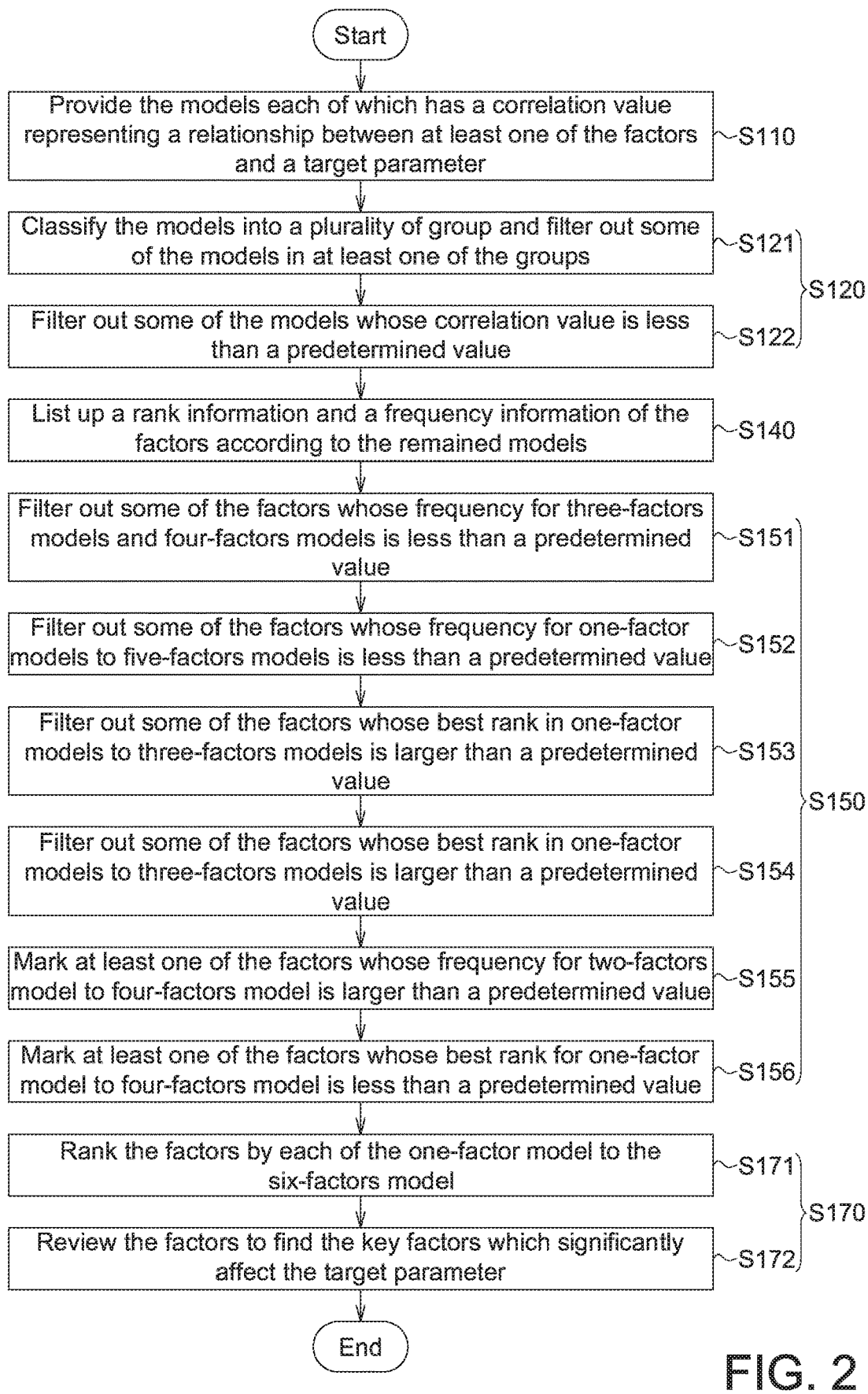
FIG. 2 shows a flowchart of an analyzing method for manufacturing data according to one embodiment.
Figure 3:
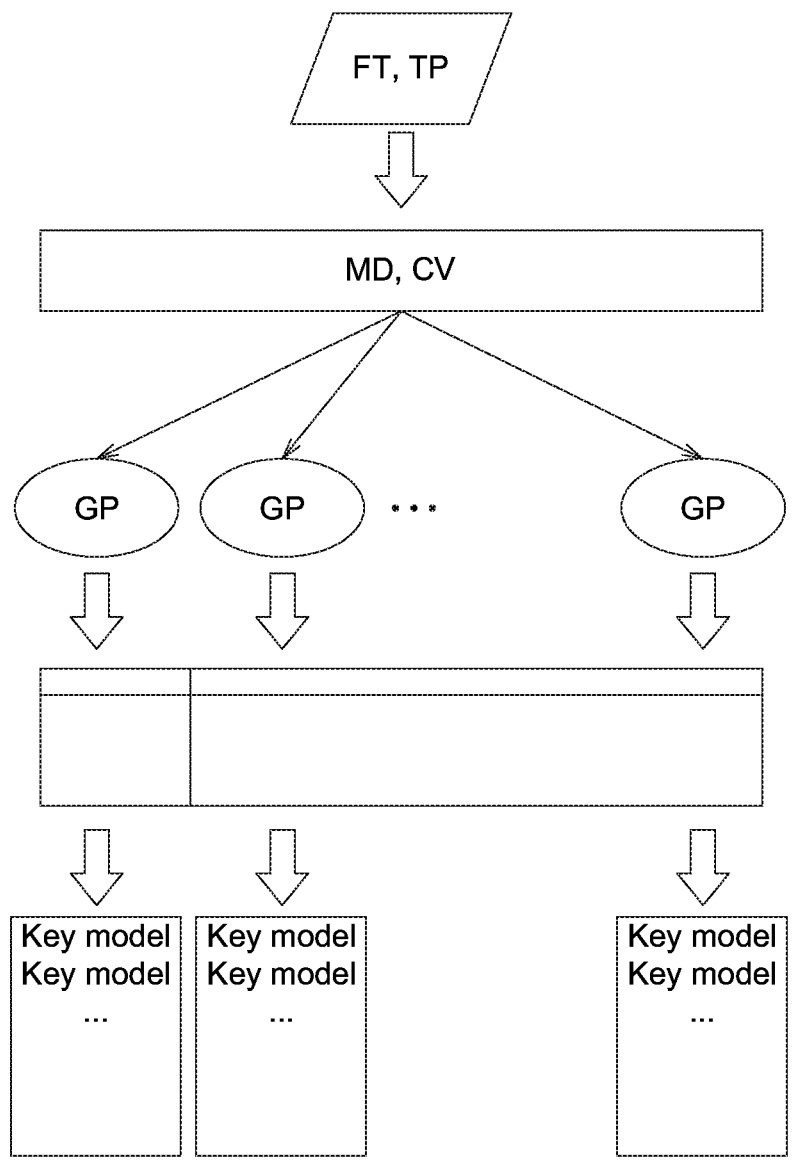
FIG. 3 illustrates the data performed during the analyzing method according to one embodiment.

Please refer to FIGS. 2 and 3. FIG. 2 shows a flowchart of an analyzing method for manufacturing data according to one embodiment. FIG. 3 illustrates the data performed during the analyzing method according to one embodiment. The operation of the analyzing system is illustrated via the analyzing method. In step S110, the model generating unit 110 provides the models MD each of which has a correlation value CV representing a relationship between at least one of the factors FT and a target parameter TP.

The factor FT may be a step, a setting parameter of an equipment or the material. The target parameter TP may be a yield rate, a critical dimension, a defect value, an inspection, a metrology, a monitor data of wafer or equipment, a result of Wafer Acceptance Test (WAT) or at least one item of the WAT. The correlation value CV may be a R-squared value, an adjusted R-squared value, a Mallow' Cp statistic value or a P-value.

The models MD may include one-factor models, two-factors models, three-factors models, . . . , and six-factors models. Each of the one-factor models represents the relationship between one of the factors FT and the target parameter TP, each of the two-factors models represents the relationship between two of the factors FT and the target parameter TP, each of the three-factors models represents the relationship between three of the factors FT and the target parameter TP, and so on.

In step S120, the model screening unit 120 screens the models MD according to the correlation values CV. In this embodiment, the step S120 includes steps S121 and S122.

Figure 4:
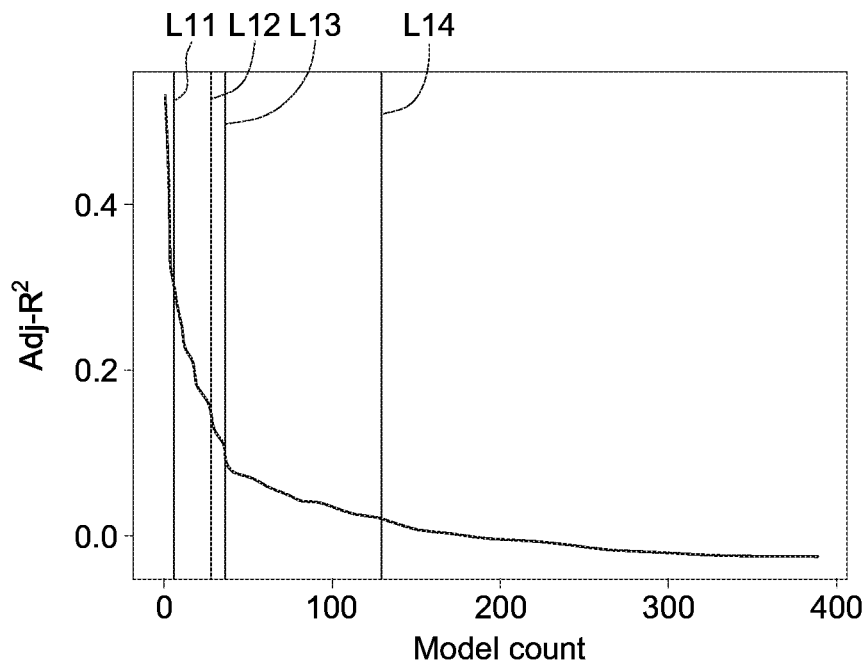
FIG. 4 shows the correlation value distribution of some of the models each of which is the one-factor model according to one embodiment.

In step S121, the model screening unit 120 classifies the models MD into a plurality of groups GP and filters out some of the models MD in at least one of the groups GP to define the most important groups (clusters) to focus on. The model screening unit 120 may classify the models MD by K-means algorithm, or Hierarchical clustering algorithm. Please refer to FIG. 4, which shows the correlation value distribution of some of the models MD each of which is the one-factor model according to one embodiment. Line L11 is the first bound of the 4-means algorithm, line L12 is the first bound of the 3-means algorithm, line L13 is the bound of the 2-means algorithm, and line L14 is the second bound of 3-means algorithm. The line L11, L12, L13 or L14 can be used to filter out some of the models MD. For example, the line L13 can be used to filter out the models MD in the last one group among the two groups.

Figure 5:
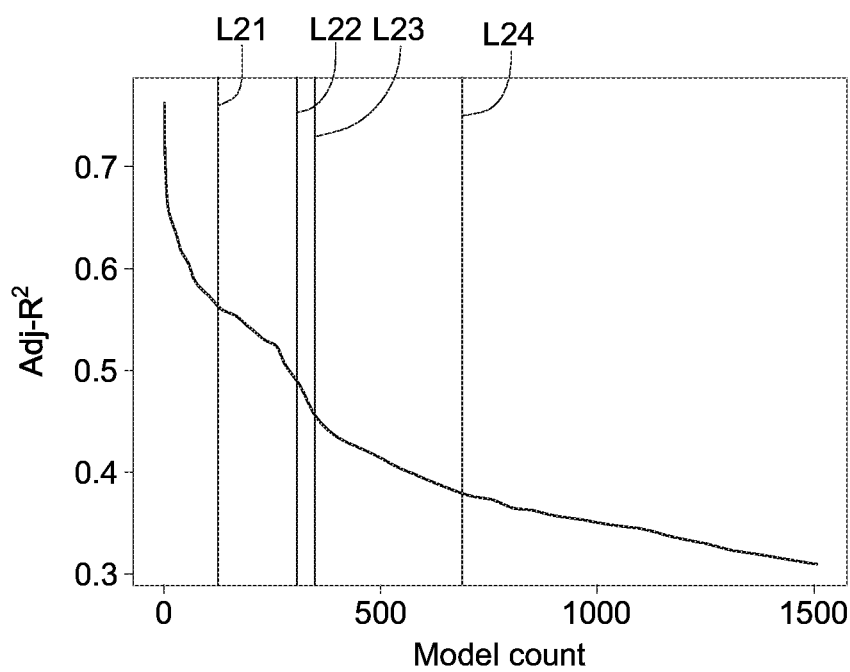
FIG. 5 shows the correlation value distribution of some of the models each of which is the two-factors model according to one embodiment.

Please refer to FIG. 5, which shows the correlation value distribution of some of the models MD each of which is the two-factors model according to one embodiment. Line L21 is the first bound of the 4-means algorithm, line L22 is the first bound of the 3-means algorithm, line L23 is the bound of the 2-means algorithm, and line L24 is the second bound of 3-means algorithm. The line L21, L22, L23 or L24 can be used to filter out some of the models MD. For example, the line L22 can be used to filter out the models MD in the last one group among the three groups.

Figure 6:
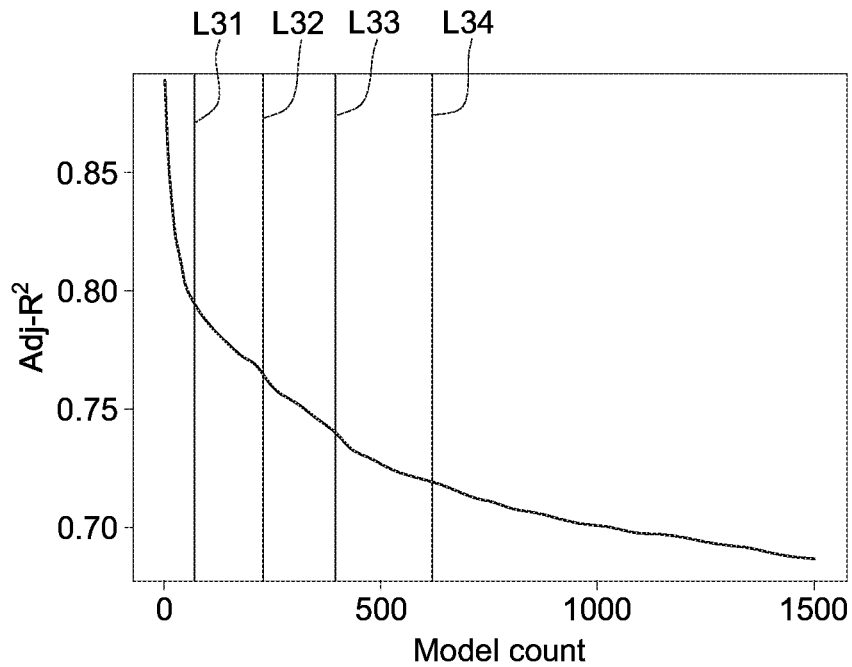
FIG. 6 shows the correlation value distribution of some of the models each of which is the three-factors model according to one embodiment.

Please refer to FIG. 6, which shows the correlation value distribution of some of the models MD each of which is the three-factors model according to one embodiment. Line L31 is the first bound of the 4-means algorithm, line L32 is the first bound of the 3-means algorithm, line L33 is the bound of the 2-means algorithm, and line L34 is the second bound of 3-means algorithm. The line L31, L32, L33 or L34 can be used to filter out some of the models MD. For example, the line L33 can be used to filter out the models MD in the last one group among the two groups.

Figure 7:
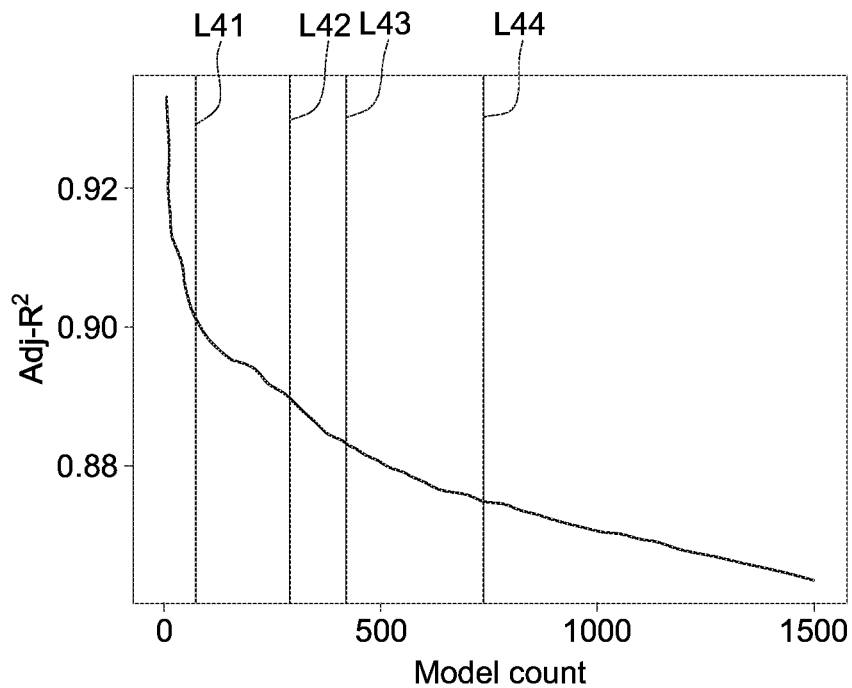
FIG. 7 shows the correlation value distribution of some of the models each of which is the four-factors model according to one embodiment.

Please refer to FIG. 7, which shows the correlation value distribution of some of the models MD each of which is the four-factors model according to one embodiment. Line L41 is the first bound of the 4-means algorithm, line L42 is the first bound of the 3-means algorithm, line L43 is the bound of the 2-means algorithm, and line L44 is the second bound of 3-means algorithm. The line L41, L42, L43 or L44 can be used to filter out some of the models MD. For example, the line L44 can be used to filter out the models MD in the last two groups among the three groups.

Figure 8:
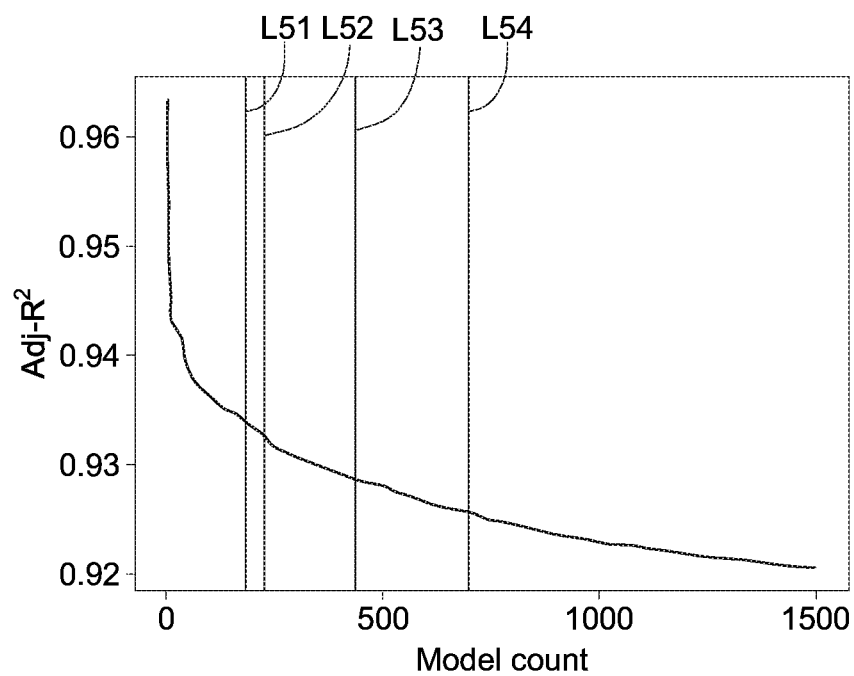
FIG. 8 shows the correlation value distribution of some of the models each of which is the five-factors model according to one embodiment.

Please refer to FIG. 8, which shows the correlation value distribution of some of the models MD each of which is the five-factors model according to one embodiment. Line L51 is the first bound of the 4-means algorithm, line L52 is the first bound of the 3-means algorithm, line L53 is the bound of the 2-means algorithm, and line L54 is the second bound of 3-means algorithm. The line L51, L52, L53 or L54 can be used to filter out some of the models MD. For example, the line L51 can be used to filter out the models MD in the last one group among the four groups.

In step S122, the model screening unit 120 filters out some of the models MD whose correlation value CV is less than a predetermined value. That is to say, the models MD which are not significant is filtered out in this step. In this step, the correlation value CV may be P-value, Coefficient, Partial Correlation's R-square or Cross Validation iterators.

In step S140, the factor information listing unit 140 lists up a rank information and a frequency information of the factors FT according to the remained models MD. For example, table I shows the rank information and the frequency information. Referring to the factor "S192_XXX", the 3th, 4th, 7th, . . . , 182th, 183th two-factors models includes this factor. The number of the two-factors models including this factor is 115 and the best rank of the two-factors models includes this factor is 3. The 19th, 30th, 72th, . . . , 393th, 394th three-factors models includes this factor. The number of the three-factors models including this factor is 83 and the best rank of the three-factors models includes this factor is 19.

TABLE I

| | Frequency | | | Rank | | | | |
|---|---|---|---|---|---|---|---|---|
| Factor FT | 2-factors model | 3-factors model | ... | Best rank of 1-factor model | Best rank of 2-factor model | Best rank of 3-factor model | Rank of 2-factors model | Rank of 3-factors model | ... |
| S192_XXX | 115 | 83 | ... | 1 | 3 | 19 | 3, 4, 7, . . . , 182, 183 | 19, 30, 72, . . . , 393, 394 | ... |
| S009_XXX | 112 | 38 | ... | 2 | 5 | 50 | 5, 6, 9, . . . , 254, 255 | 50, 53, 66, . . . , 386, 395 | ... |
| S084_XXX | 27 | 134 | ... | 3 | 1 | 4 | 1, 3, 9, . . . , 342, 344 | 4, 5, 8, . . . , 392, 394 | ... |
| . | . | . | . | . | . | . | . | . | . |
| . | . | . | . | . | . | . | . | . | . |
| . | . | . | . | . | . | . | . | . | . |

In step S150, the factor screening unit 150 screens the factors FT according to the rank information and the frequency information. In this embodiment, the step S150 includes steps S151 to S155.

In step S151, the factor screening unit 150 filters out some of the factors FT whose frequency for three-factors models and four-factors models is less than a predetermined value, such as 5.

In step S152, the factor screening unit 150 filters out some of the factors FT whose frequency for one-factor models to five-factors models is less than a predetermined value, such as 10.

In step S153, the factor screening unit 150 filters out some of the factors FT whose best rank in one-factor models to three-factors models is larger than a predetermined value, such as 100.

In step S154, the factor screening unit 150 reserves some of the factors FT whose best rank in one-factor models to three-factors models is less than a predetermined value, such as 10.

After performing the step S151 to S154, the frequency information and the rank information can be listed as the following table II.

TABLE II

| | Frequency | | | Rank | | | |
|---|---|---|---|---|---|---|---|
| Factor | 2-factors model | 3-factors model | 4-factors model | 1-factor model | 2-factors model | 3-factors model | 4-factors model |
| S001_XXX | 81 | 2 | 3 | 105 | 60 | 246 | 199 |
| S008_XXX | 1 | 3 | 9 | — | 100 | 23** | 39 |
| S008_YYY* | 2 | 9 | 109*** | 147 | 8** | 1** | 5** |
| S009_XXX* | 112*** | 38 | 9 | 2* | 5** | 50 | 1** |
| S012_XXX* | 2 | 2 | 35 | 138 | 64 | 5** | 24** |
| S012_YYY | 2 | 5 | 19 | — | 65 | 27** | 1** |
| S012_ZZZ | 3 | 4 | 3 | 18** | 14** | 26 | 264 |
| S014_XXX | 2 | 1 | 6 | — | 183 | 95 | 7** |
| S014_XXX | 1 | 3 | 2 | — | 205 | 12 | 97 |
| S014_XXX* | 6 | 7 | 3 | 23** | 18** | 21** | 214 |
| S015_XXX | 8 | 5 | 2 | 21** | 20** | 59 | 364 |
| S019_XXX | 2 | 3 | 2 | — | 97 | 44 | 10** |
| S020_XXX* | 2 | 7 | 68*** | 88 | 15** | 7** | 28** |
| S022_XXX* | 4 | 7 | 11 | 99 | 6** | 6** | 12** |
| S022_XXX* | 10 | 11 | 4 | 8** | 4** | 14** | 65 |

In step S155, the factor screening unit 150 marks at least one of the factors FT whose frequency for two-factors model to four-factors model is larger than a predetermined value, such as 50. For example, the frequency for two-factors model to four-factors model is larger than 50 is marked as "***."

In step S156, the factor screening unit 150 marks at least one of the factors FT whose best rank for one-factor model to four-factors model is less than a predetermined value, such as 30. For example, the best rank for one-factor model to four-factors model is less than 30 is marked as "." According to the mark "" and "***", some of the factors FT which is highly important can be marked as "*."

In step S170, the reporting unit 170 ranks the models MD and selects at least one of the models MD. In this embodiment, the step S170 includes steps S171 and S172.

In step S171, the reporting unit 170 ranks the factors FT by each of the one-factor model to the six-factors model. For example, referring to table 1111, the factors FT are ranked by the two-factors model. Referring to table IV, the factors FT are ranked by the three-factors model.

TABLE III

| Rank | Factor | Factor | Size | Adjust R-square | R-square |
|---|---|---|---|---|---|
| 1 | S084_XXX | S148_XXX | 41 | 0.76279213 | 0.774652524 |
| 2 | S074_XXX | S146_XXX | 41 | 0.741437024 | 0.754365173 |
| 3 | S084_XXX | S192_XXX | 41 | 0.710439436 | 0.724917502 |
| 4 | S022_XXX* | S192_XXX | 41 | 0.687215953 | 0.702855155 |
| 5 | S009_XXX* | S195_XXX | 41 | 0.685603568 | 0.701323389 |
| 6 | S009_XXX* | S022_XXX* | 41 | 0.679093697 | 0.695139013 |
| 7 | S033_XXX | S192_XXX | 41 | 0.674618943 | 0.690887996 |
| 8 | S008_XXX* | S192_XXX | 41 | 0.666775805 | 0.683437015 |
| 9 | S009_XXX* | S192_XXX | 41 | 0.659653345 | 0.676670678 |
| 10 | S192_XXX | S202_XXX | 41 | 0.659324351 | 0.676868134 |

TABLE IV

| Rank | Factor | Factor | Factor | Size | Adjust R-square | R-square |
|---|---|---|---|---|---|---|
| 1 | S008_XXX* | S074_XXX | S146_XXX | 41 | 0.889209031 | 0.897518354 |
| 2 | S023_XXX | S074_XX | S146_XXX | 41 | 0.87038388 | 0.880105089 |
| 3 | S074_XXX | S146_XXX | S202_XXX | 41 | 0.870280366 | 0.880009339 |
| 4 | S059_XXX | S084_XXX | S148_XXX | 41 | 0.865635038 | 0.875712411 |
| 5 | S012_XXX* | S084_XXX | S148_XXX | 41 | 0.86499644 | 0.875121707 |
| 6 | S022_XXX* | S074_XXX | S146_XXX | 41 | 0.862045922 | 0.872392478 |
| 7 | S020_XXX* | S074_XXX | S146_XXX | 41 | 0.860329345 | 0.870897144 |
| 8 | S084_XXX | S148_XXX | S209_XXX | 41 | 0.89985488 | 0.870486576 |
| 9 | S022_XXX | S084_XXX | S148_XXX | 41 | 0.854568131 | 0.868250521 |
| 10 | S074_XXX | S084_XXX | S146_XXX | 41 | 0.856946666 | 0.867675666 |

In step S172, the factors FT are reviewed to find the key factors FT which significantly affect the target parameter TP. For example, some of the models MD including the factors FT marked "*" can be selected.

According to the embodiments described above, the analyzing system 100 and the analyzing method can efficiently search the key model MD and key factor FT thereof by screening and reserving top few key models MD and screening out key factors FT layer by layer.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An analyzing method for manufacturing data, comprising:
   providing a plurality of models each of which has a correlation value representing a relationship between at least one of a plurality of factors and a target parameter;
   screening, by a model screening circuit, the models according to the correlation values, wherein some of the models whose correlation values are less than a first predetermined value are filtered out;
   listing up a rank information and a frequency information of the factors according to the models;
   screening, by a factor screening circuit, the factors according to the rank information and the frequency information, wherein some of the factors whose frequencies for the models are less than a second predetermined value are filtered out and some of the factors whose best ranks in the models are less than a third predetermined value are filtered out; and
   ranking the models and selecting at least one of the models, wherein the at least one of the models is selected according to the frequencies and the best ranks of the models.

2. The analyzing method for manufacturing data according to claim 1, wherein the step of screening the models according to the correlation values includes:
   classifying the models into a plurality of groups and filtering out some of the models in at least one of the groups, wherein some of the models are filtered out according to the correlation values of the models.

3. The analyzing method for manufacturing data according to claim 1, wherein the step of screening the models according to the correlation values includes:
   filtering out some of the models whose correlation value is less than a predetermined value.

4. The analyzing method for manufacturing data according to claim 1, wherein the step of screening the factors according to the rank information and the frequency information includes:
   filtering out some of the factors whose frequency for three-factors models and four-factors models is less than a predetermined value.

5. The analyzing method for manufacturing data according to claim 1, wherein the step of screening the factors according to the rank information and the frequency information includes:
   filtering out some of the factors whose frequency for one-factor models to five-factors models is less than a predetermined value.

6. The analyzing method for manufacturing data according to claim 1, wherein the step of screening the factors according to the rank information and the frequency information includes:
   filtering out some of the factors whose best rank in one-factor models to three-factors models is larger than a predetermined value.

7. The analyzing method for manufacturing data according to claim 1, wherein the step of screening the factors according to the rank information and the frequency information includes:
   reserving some of the factors whose best rank in one-factor models to three-factors models is less than a predetermined value.

8. The analyzing method for manufacturing data according to claim 1, wherein the step of screening the factors according to the rank information and the frequency information includes:
   marking at least one of the factors whose frequency for two-factors model to four-factors model is larger than a predetermined value.

9. The analyzing method for manufacturing data according to claim 1, wherein the step of screening the factors according to the rank information and the frequency information includes:
   marking at least one of the factors whose best rank for one-factor model to four-factors model is less than a predetermined value.

10. An analyzing system for manufacturing data, comprising:
    a model generating unit for providing a plurality of models each of which has a correlation value representing a relationship between at least one of a plurality of factors and a target parameter;
    a model screening circuit for screening the models according to the correlation values, wherein some of the models whose correlation values are less than a first predetermined value are filtered out;

a factor information listing unit for listing up a rank information and a frequency information of the factors according to the models;
a factor screening circuit for screening the factors according to the rank information and the frequency information, wherein some of the factors whose frequencies for the models are less than a second predetermined value are filtered out and some of the factors whose best ranks in the models are less than a third predetermined value are filtered out; and
a reporting unit for ranking the models.

11. The analyzing system for manufacturing data according to claim 10, wherein the model screening circuit classifies the models into a plurality of groups and filters out some of the models in at least one of the groups, wherein some of the models are filtered out according to the correlation values of the models.

12. The analyzing system for manufacturing data according to claim 10, wherein the model screening circuit filters out some of the models whose correlation value is less than a predetermined value.

13. The analyzing system for manufacturing data according to claim 10, wherein the factor screening circuit filters out some of the factors whose frequency for three-factors models and four-factors models is less than a predetermined value.

14. The analyzing system for manufacturing data according to claim 10, wherein the factor screening circuit filters out some of the factors whose frequency for one-factor models to five-factors models is less than a predetermined value.

15. The analyzing system for manufacturing data according to claim 10, wherein the factor screening circuit filters out some of the factors whose best rank in one-factor models to three-factors models is larger than a predetermined value.

16. The analyzing system for manufacturing data according to claim 10, wherein the factor screening circuit reserves some of the factors whose best rank in one-factor models to three-factors models is less than a predetermined value.

17. The analyzing system for manufacturing data according to claim 10, wherein the factor screening circuit marks at least one of the factors whose frequency for two-factors model to four-factors model is larger than a predetermined value.

18. The analyzing system for manufacturing data according to claim 10, wherein the factor screening circuit marks at least one of the factors whose best rank for one-factor model to four-factors model is less than a predetermined value.

* * * * *